United States Patent [19]
Ye et al.

[11] Patent Number: 6,154,045
[45] Date of Patent: Nov. 28, 2000

[54] METHOD AND APPARATUS FOR REDUCING SIGNAL TRANSMISSION DELAY USING SKEWED GATES

[75] Inventors: Yibin Ye, Portland; Shih-Lien Lu, Corvallis; Vivek K. De; Siva Narendra, both of Beaverton, all of Oreg.

[73] Assignee: Intel Corporation, Santa Clara, Calif.

[21] Appl. No.: 09/218,723

[22] Filed: Dec. 22, 1998

[51] Int. Cl.$^7$ .............................. H03K 19/01; H03K 5/12; H03K 19/175

[52] U.S. Cl. ................................ 326/17; 326/93; 326/83; 327/170; 327/108

[58] Field of Search .................................. 326/17, 36, 35, 326/93, 82, 83, 86; 327/170, 108

[56] References Cited

U.S. PATENT DOCUMENTS

| | | | |
|---|---|---|---|
| 4,890,016 | 12/1989 | Tanaka et al. | 326/27 |
| 5,383,155 | 1/1995 | Ta | 365/191 |
| 5,453,708 | 9/1995 | Gupta et al. | 326/98 |
| 5,519,344 | 5/1996 | Proebsting | 327/108 |
| 5,619,146 | 4/1997 | Fujii et al. | 326/21 |
| 5,856,746 | 1/1999 | Petrick | 326/17 |
| 5,926,050 | 7/1999 | Proebsting | 327/170 |

OTHER PUBLICATIONS

Hedenstierna, et al., "CMOS Circuit Speed and Buffer Optimization", *IEEE Transactions on Computer-Aided Design*. vol. CAD-6, No. 2 Mar. 1987, pp. 270–281.

Jason Cong, "Modeling and Layout Optimization of VLSI Devices and Interconnects In Deep Submicron Design", Department Of Computer Science, University of California, Los Angeles, pp. 1–6. No Date.

John Lillis, et al., "Optimal Wire Sizing and Buffer Insertion for Low Power and a Generalized Delay Model", University of California, San Diego, pp. 1–6. No Date.

Lukas P.P.P. van Ginneken, "Buffer Placement in Distributed RC–tree Networks for Minimal Elmore Delay", International Business Machines Corporation, Thomas J. Watson Research Center, Yorktown Heights, New York, 1990 *IEEE*, pp. 865–868.

Thompson, et al.; "Dual Threshold Voltages and Substrates Bias: Keys to High Performances, Low Power, 0.1 $\mu$m Logic Designs"; 1997 Symposium on VLSI Technology Digest of Technical Papers; Jan. 1997; pp. 69–70.

Kawaguchi, et al.; "A CMOS Scheme for 0.5V Supply Voltage with Pico–Ampere Standby Current"; IEEE International Solid–State Conference; Paper FP 12.4; Jan. 1998; pp. 192–193.

Mutoh, et al.; "1–V Power Supply High–Speed Digital Circuit Technology with Multithreshold–Voltage CMOS"; IEEE Journal of Solid State Circuits; vol. 30 No. 8 Aug. 1995; pp. 847–854.

Halter, et al.; "A Gate–Level Leakage Power Reduction Method for Ultra–Low–Power CMOS Circuits"; IEEE Custom Integrated Circuit Conference; Aug. 1997; pp. 1–4.

Kuroda, et al.; "A 0.9–V, 150–MHz, 10–mW, 4 mm$_2$, 2–D Discrete Cosine Transform Core Processor with Variable Threshold–Voltage (VT) Scheme"; IEEE Journal of Solid–State Circuits, vol. 31, No. 11, Nov. 1996; pp. 1770–1779.

*Primary Examiner*—Michael Tokar
*Assistant Examiner*—Daniel D. Chang
*Attorney, Agent, or Firm*—Blakely, Sokoloff, Taylor & Zafman LLP

[57] ABSTRACT

Alternately skewed gates to reduce signal transmission delay. For one embodiment, an integrated circuit includes a chain of gates alternately skewed for fast rise and fast fall. Pulse encoding logic coupled to the chain of gates pulse encodes a signal to be provided to and transmitted by the chain of alternately skewed gates.

26 Claims, 13 Drawing Sheets

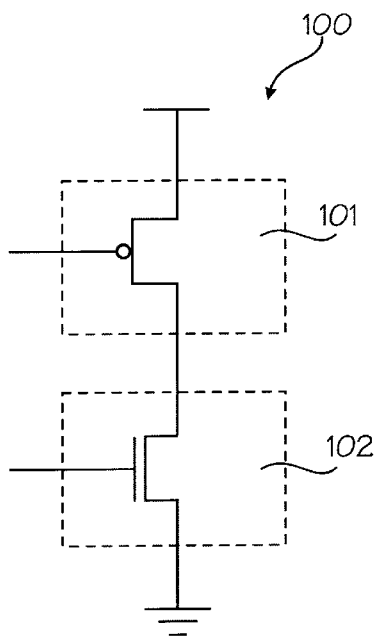
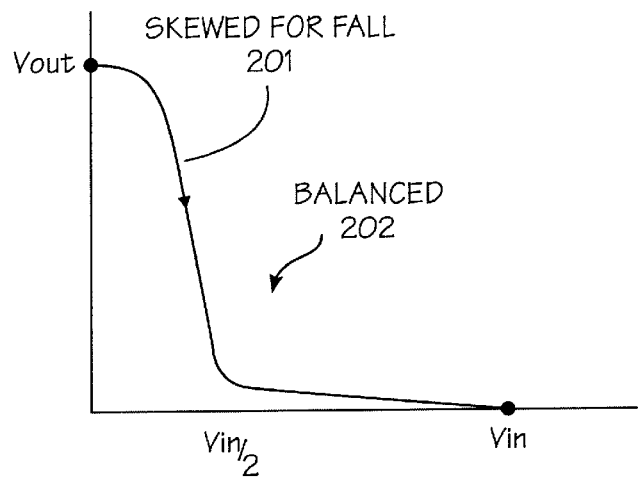
Fig. 1
Fig. 2
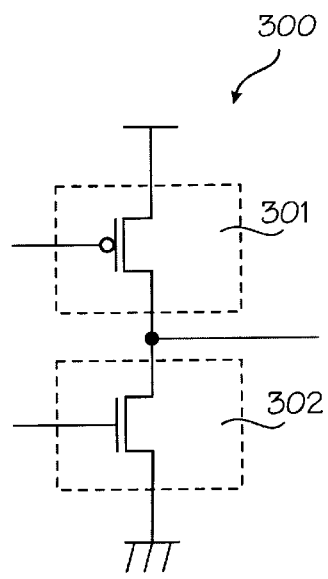
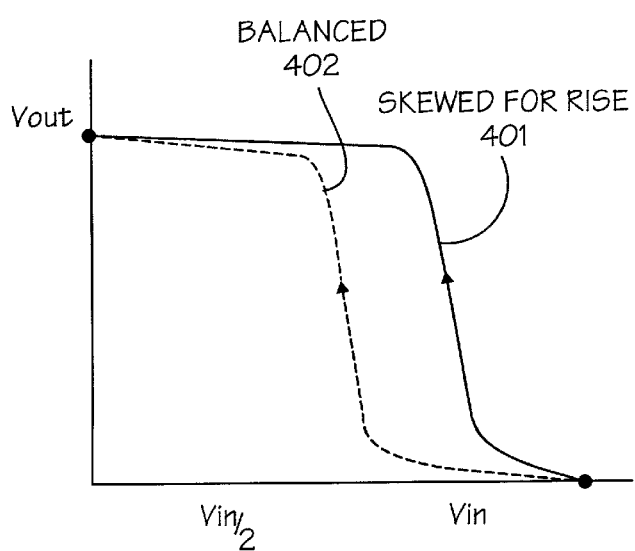
Fig. 3
Fig. 4

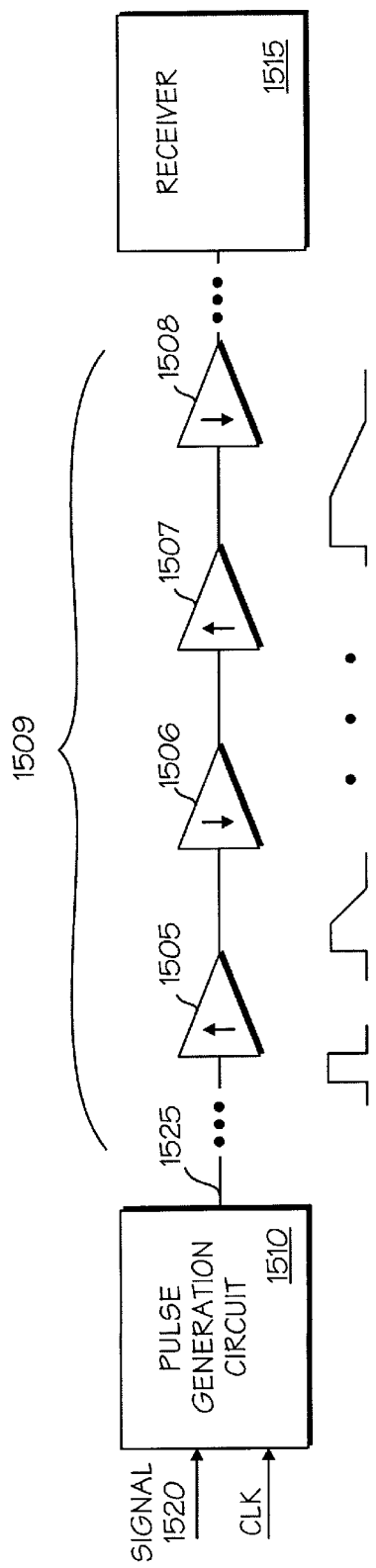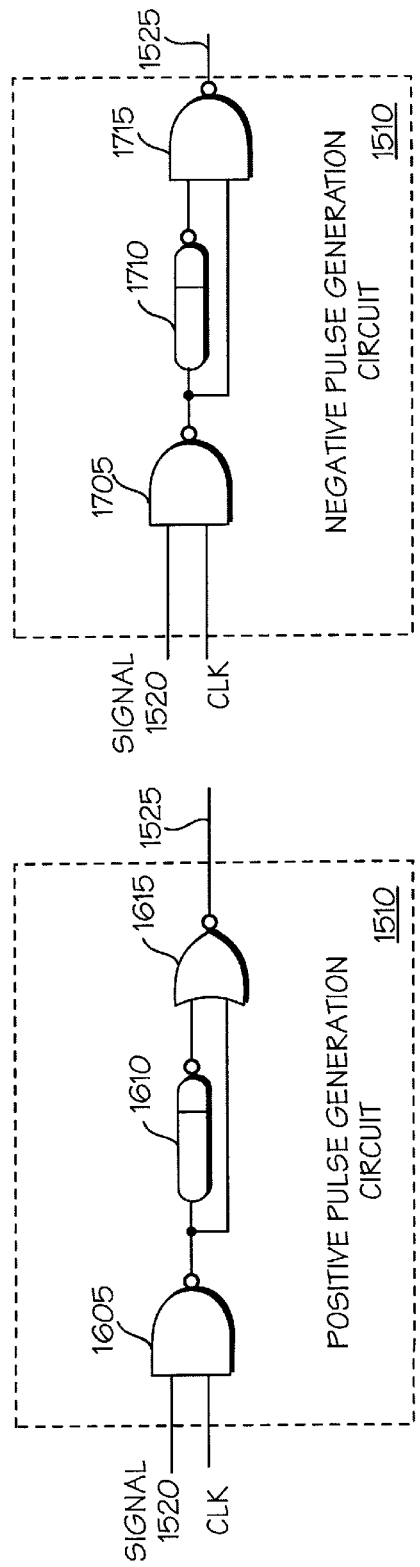

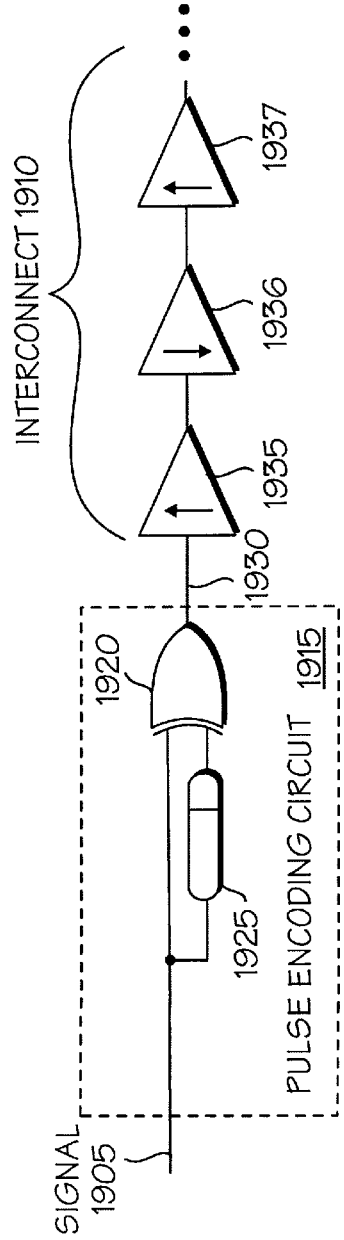
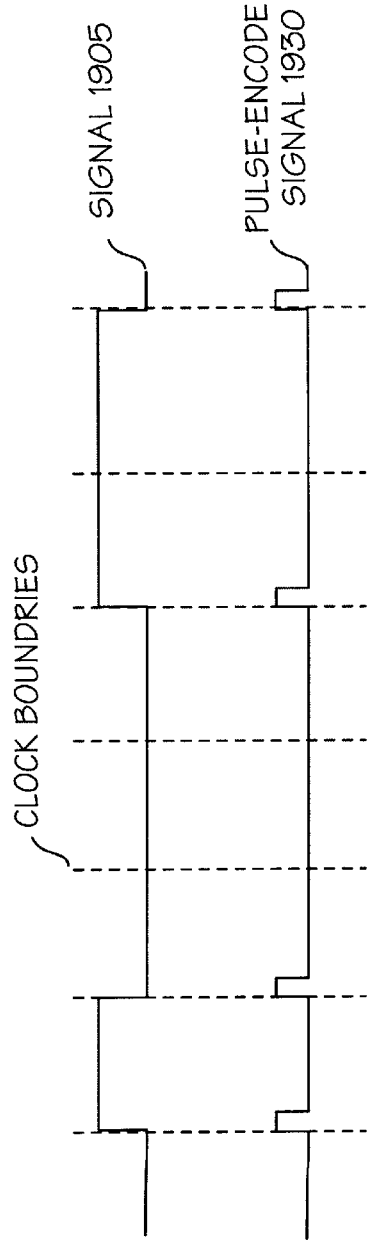
Fig. 19
Fig. 20

METHOD AND APPARATUS FOR REDUCING SIGNAL TRANSMISSION DELAY USING SKEWED GATES

BACKGROUND

1. Field

An embodiment of the present invention relates to integrated circuits, and more particularly, to reducing signal transmission delay using skewed gates.

2. Discussion of Related Art

With the scaling of semiconductor process technologies, threshold voltages of metal oxide semiconductor circuits are typically being reduced with reductions in supply voltages in order to maintain circuit performance. Lower transistor threshold voltages lead to significant increases in leakage current due to the exponential nature of sub-threshold conductance.

Increased leakage current can be a problem for all types of logic, but in particular, for domino and other dynamic logic. Domino logic is widely used in many high speed critical-paths in microprocessors, for example, due to its speed and area advantage over static complementary metal oxide semiconductor (CMOS) logic. Increases in leakage current cause severe noise problems for domino and other dynamic logic because of the use of precharge logic in such circuits.

One approach to addressing the higher leakage current that results from lower threshold voltages has been to use a dual threshold voltage technique. In a dual threshold voltage approach, certain devices on a particular integrated circuit are designed and fabricated to have a first, low threshold voltage, while other devices on the same integrated circuit are designed and fabricated to have a second, higher threshold voltage. In this manner, devices, such as devices in dynamic circuits that cannot tolerate the higher leakage current characteristic of lower threshold voltages can be selected to have higher threshold voltages.

Using this approach, in the sub-1 volt supply voltage region, the threshold voltages of devices used in domino logic are typically raised over that of static CMOS logic in order to provide an adequate noise margin. For this reason, the performance advantage of domino logic can degrade with technology advancement. In fact, at some point, the performance of domino logic falls below that of static CMOS logic as supply voltages continue to decrease. Further, semiconductor processing of such circuits is complicated by the need to provide transistors having multiple threshold voltage on the same integrated circuit die.

Another consequence of technology scaling is that interconnect delays are becoming a more important factor in terms of determining the performance of high speed integrated circuits such as microprocessors. For example, a larger and larger percentage of a processor clock cycle is now attributed to interconnect delay.

One approach to addressing this issue has been to insert repeaters, typically buffers or inverters, at various points along an interconnect. Interconnect delay is proportional to the square of the length of the interconnect wire. These repeaters are inserted to bring the interconnect delay back to a range where it is approximately linearly proportional to the length of the interconnect wire.

While this approach is helpful, there is still a need to further reduce interconnect delay as integrated circuit technologies continue to increase in speed.

SUMMARY OF THE INVENTION

A method and apparatus for reducing signal transmission delay using skewed gates are described.

For one embodiment, an integrated circuit includes a chain of alternately skewed gates and pulse encoding logic to pulse encode a signal to be provided to and transmitted by the chain of alternately skewed gates.

Other features and advantages of the present invention will be apparent from the accompanying drawings and from the detailed description that follows below.

BRIEF DESCRIPTION OF THE DRAWINGS

The present invention is illustrated by way of example and not limitation in the figures of the accompanying drawings in which like references indicate similar elements, and in which:

FIG. 1 is a schematic diagram of a portion of a logic gate that is skewed for a fast high-to-low transition.

FIG. 2 is a graphical representation of the direct current (DC) transfer characteristic of the gate of FIG. 1 compared to a similar balanced gate.

FIG. 3 is a schematic diagram of a portion of a logic gate that is skewed for a fast low-to-high transition.

FIG. 4 is a graphical representation of the DC transfer characteristic of the gate of FIG. 2 compared to a similar balanced gate.

FIG. 15 is a block diagram showing a signal transmission delay reduction approach of another embodiment for use with interconnects.

FIG. 16 is a logic diagram showing one embodiment of positive pulse generation logic that may be used with the approach shown in FIG. 15.

FIG. 17 is a logic diagram showing one embodiment of negative pulse generation logic that may be used with the approach shown in FIG. 15.

- FIG. 19 is a block and logic diagram showing a signal transmission delay reduction approach of another embodiment using an alternate pulse encoding scheme.

FIG. 20 is a timing diagram showing an exemplary input signal for the circuit of FIG. 19 and a corresponding pulse-encoded output signal.

DETAILED DESCRIPTION

Figure 5:
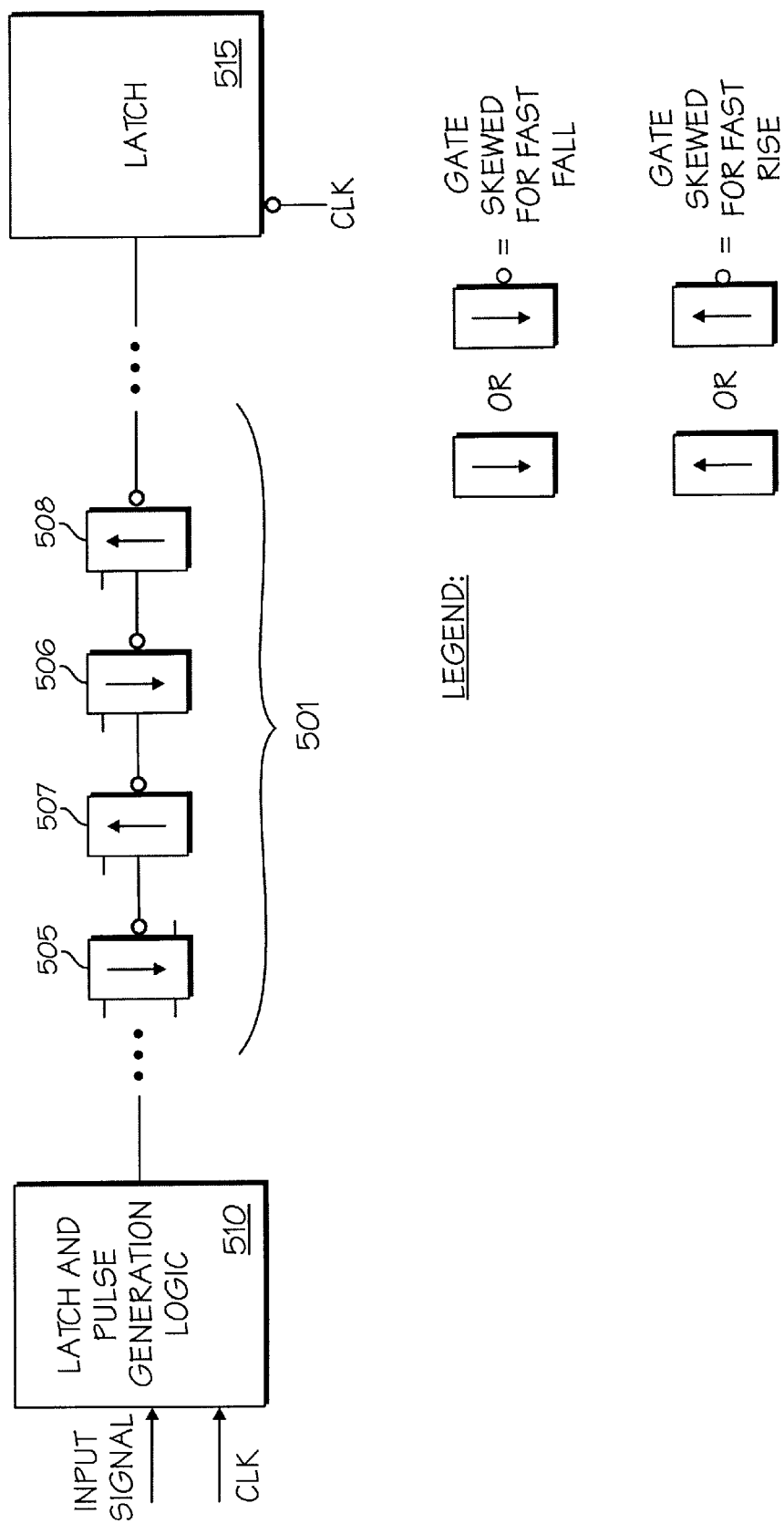
FIG. 5 is a block diagram showing a chain of alternately skewed gates between latch boundaries in accordance with one embodiment.

A method and apparatus for reducing signal transmission delay using skewed gates is described. In the following description, particular types of circuits and circuit elements are described for purposes of illustration. It will be appreciated, however, that other embodiments are applicable to other types of circuits. Further, although complementary metal oxide semiconductor (CMOS) gates are referred to in the illustrations that follow, it will be appreciated by those of skill in the art that the embodiments described below are also applicable to various other types of processing technologies.

For one embodiment, an integrated circuit includes a chain of gates coupled in series (i.e. at least one output of a first gate is coupled to at least one input of the next gate in the chain of gates). The chain of gates includes gates skewed for fast rise and gates skewed for fast fall. The fast rise and fast fall gates are arranged alternately along the chain of gates. The chain of gates may be included in a logic block, for example, or along an interconnect as described in more detail below.

In contrast, in standard static CMOS circuits, for example, the sizes of p-type metal oxide semiconductor (PMOS) devices and n-type metal oxide semiconductor (nMOS) devices are typically ratioed such that the rise time of a signal provided at a gate output is approximately the same as the fall time of a signal provided at the same gate output. By ratioing the gates in this manner, a CMOS gate does not favor either a rising or falling signal output in terms of the speed at which the output signal transitions. For most gates, this is important because their outputs typically vary for different logical inputs and/or operating conditions, for example.

As described in more detail below, by alternately skewing gates in a chain of gates for fast rise and fast fall in accordance with embodiments of the present invention, the total signal delay through the chain of gates is reduced as compared to the delay experienced by a signal transmitted through a chain of similar gates that are not skewed (i.e gates that have the sizes of the p-type and n-type gates ratioed for substantially equal rise and fall times, alternately referred to herein as balanced gates).

FIG. 1 is a schematic diagram showing an exemplary gate 100 in accordance with one embodiment that is skewed for fast fall. The skewed gate 100 includes a p-type device 101 and an n-type device 102. For the gate 100, the emboldened body of the n-type device 102 indicates that it is skewed to be stronger than the p-type device 101.

Skewing n-type device(s) to be stronger than p-type device(s) in a particular logic gate, such as the gate 100, causes a signal at the gate output to transition from high to low, or to fall, more quickly than a gate that includes devices ratioed for approximately equal rise and fall times. A gate that is skewed in such a manner is referred to alternately herein as a gate skewed for fast fall, a fast fall gate, a skewed-for-fall gate or a fall-skewed gate.

The faster fall of the output signal is primarily due to two factors: 1) earlier triggering of the falling transition as a result of a lower input inversion voltage of the stronger n-type gate, and 2) the smaller capacitive load per micrometer of the driving nMOS transistor because only the nMOS transistors are skewed to be stronger or pMOS transistors are skewed to be weaker.

FIG. 2 is a graph showing the DC transfer characteristic 201 of a gate, such as the gate 100, that is skewed for fast fall. For comparison purposes, the DC transfer characteristic of a similar gate that is balanced, i.e. not skewed for either fast rise or fast fall, is shown by the dotted line 202.

For the same reasons a fall-skewed gate exhibits a faster high-to-low output signal transition than a balanced gate, a fall-skewed gate also exhibits a slower low-to-high output signal transition than a balanced gate.

FIG. 3 is a schematic diagram showing an exemplary gate 300 in accordance with one embodiment that is skewed for fast rise. The gate 300 includes an n-type device 302 and a p-type device 301. For the gate 300, the p-type device 301 is skewed to be stronger than the n-type device 302 as indicated in FIG. 3 by the emboldened body of the p-type device 301.

Skewing p-type device(s) to be stronger than n-type device(s) in a particular logic gate such as the gate 300 causes a signal at the gate output to transition from low to high, or to rise, more quickly than a gate that includes devices ratioed for approximately equal rise and fall times. A gate that is skewed in such a manner is referred to alternately herein as a gate skewed for fast rise, a fast rise gate, a skewed-for-rise gate or a rise-skewed gate.

The faster rise of the output signal is due to similar factors as those described above with reference to the fast-fall gate 100 of FIG. 1.

FIG. 4 is a graph showing the DC transfer characteristic 401 of a gate, such as the gate 300, that is skewed for fast rise. For comparison purposes, the DC transfer characteristic of a similar balanced gate is shown by the dotted line 402. Similar to the fast-fall gate 100 of FIG. 1, while the fast-rise gate 300 of FIG. 3 provides a faster low-to-high signal transition at its output(s), the fast-rise gate 300 also provides a slower high-to-low signal transition at its output(s) than a similar balanced gate.

In accordance with various embodiments, to achieve an overall signal transmission speed benefit over a chain of series-connected gates, fast-rise gates are alternated with fast fall gates and vice versa, as described in more detail below.

FIG. 5 is a block diagram showing an example of a chain 501 of series-coupled gates for one embodiment. As shown in FIG. 5, the chain of gates 501 includes gates 505 and 506 skewed for fast fall (indicated by a rectangular box enclosing a downward-pointing arrow) alternated with gates 507 and 508, skewed for fast rise (indicated by a rectangular box enclosing an upward-pointing arrow). Each of the gates 505–508 may perform a different function and may have several inputs and/or outputs. Further, each of the gates 505–508 may include multiple n-type and/or p-type devices.

Where this is the case, all or a majority of the n-type devices of the fall-skewed gates 505 and 506 are skewed to be stronger than the p-type devices of the respective gate. Similarly, all or a majority of the p-type devices of the rise-skewed gates 507 and 508 are skewed to be stronger than the n-type devices of the respective gate.

For some embodiments, the chain of gates 501 may include additional gates as indicated by the dotted lines at either end of the chain 501. Further, for other embodiments, one or more balanced gates may be inserted between any two of the skewed gates 505–508. Where such balanced gates are inserted between skewed gates, the chain of gates is still referred to herein as being a chain of alternately skewed gates because, in accordance with various embodiments, a gate skewed for fast rise is provided between two gates skewed for fast fall and vice versa.

For one embodiment, the chain of gates 501 is coupled between latch and pulse generation logic 510 and a latch 515. In order for the skewed gates 505–508 to offer a performance advantage, a signal transition in one direction must be propagated faster than a signal transition in another direction. Thus, the chain of gates 501 operates in two phases for one embodiment: evaluate and reset. To provide the evaluate and reset phases, the primary inputs to the chain 501 of gates are encoded as pulses to provide time for the reset phase. The latch and pulse generation logic 510 operates to both latch the incoming data directed to the chain of gates 501 and to encode the incoming data into corresponding pulses to provide input data to the chain of gates 501.

The input data may be encoded using either positive or negative pulse encoding. Using positive pulse encoding, a positive pulse is generated for logical one input data. Otherwise, the input signal is at a logical zero level. The rising edge of the positive pulse indicates the evaluate phase while the falling edge of the positive pulse begins the reset phase.

In contrast, using negative pulse encoding, the input signal is at a logical 1 level and a logical 0 pulse is generated for logical 0 input data. The evaluate phase begins on a falling edge of a negative pulse while the rising edge of the negative pulse indicates the beginning of a reset phase.

For one embodiment, the determination of whether to use positive or negative pulse encoding is based on the function and skewing of the gate (not shown in FIG. 5) that is directly coupled to the latch and pulse generation logic.

Figure 6:
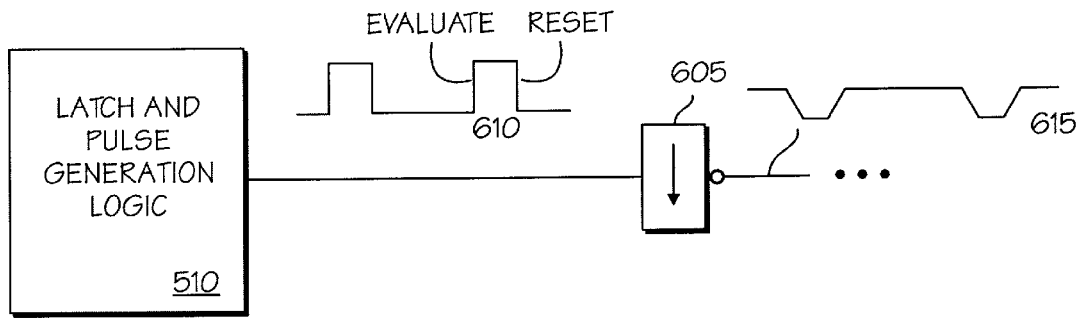
FIG. 6 is a block diagram wherein a first gate coupled to the latch and pulse generation logic of FIG. 5 is a fast fall gate and data is encoded using positive pulse encoding.

For example, referring to FIG. 6, if the first gate 605 immediately coupled to the latch and pulse generation logic 510 is an inverter that is skewed to be a fast fall gate, incoming data 610 is encoded using positive pulses as shown. Because the gate 605 is an inverter in this example, the output 615 of the gate 605 remains at a logical high level unless a positive pulse is received at the gate 605 input. When a positive pulse is received at the gate 605 input, the output 615 of the gate 605 transitions quickly to a low level because it is a fast-fall gate.

The pulse is widened at the output of the gate 605 as shown by output signal 615 because the gate 605 has a slower rise time. The rise time is less important, however, because data is indicated on the falling edge of the output pulse and reset occurs on the rising edge. Where logical 0 input data is received, no output signal transition is required because the output signal 615 has been reset to a logical high level.

Figure 7:
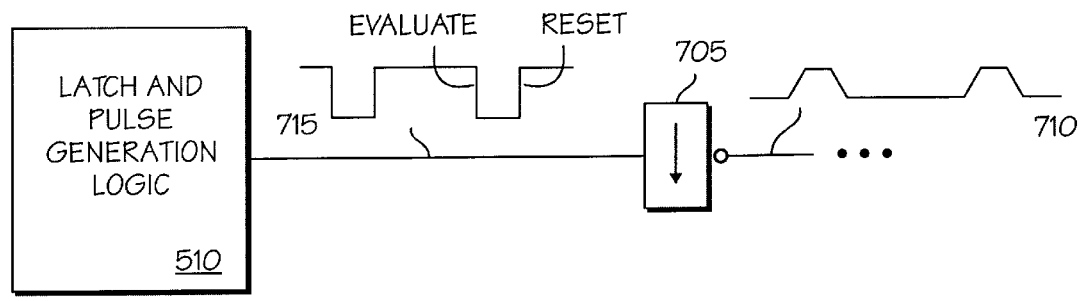
FIG. 7 is a block diagram wherein a first gate coupled to the latch and pulse generation logic of FIG. 5 is a fast rise gate and data is encoded using negative pulse encoding.

Referring to FIG. 7, if the first gate 705 immediately coupled to the latch and pulse generation logic 510 is instead an inverter skewed for fast rise, for example, a negative pulse encoding scheme is used for similar reasons. The output 710 of the gate 705 transitions quickly to a high level in response to low input data 715 and is reset at a logical low output level following the evaluate phase.

Figure 8:
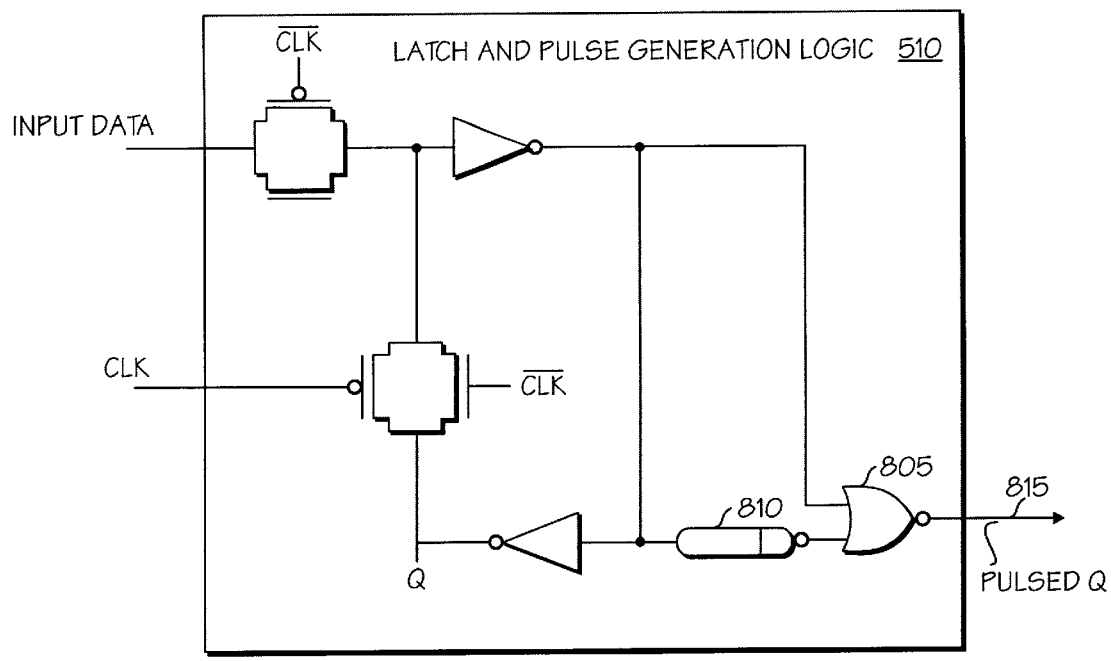
FIG. 8 is a schematic diagram of static latch and pulse generation logic of one embodiment that provides positive pulse encoding.

FIG. 8 is a schematic diagram of one embodiment of the latch and pulse generation logic 510 that may be used where a positive pulse encoding scheme is used. The latch and pulse generation logic 510 of FIG. 8 latches incoming data which is then provided to one input of a NOR gate 805. The incoming data is also provided to a delay element 810 that has an output coupled to a second input of the NOR gate 805. Through this arrangement, pulse-encoded data is provided at the output 815 of the latch and pulse generation logic 510 of FIG. 8.

Figure 9:
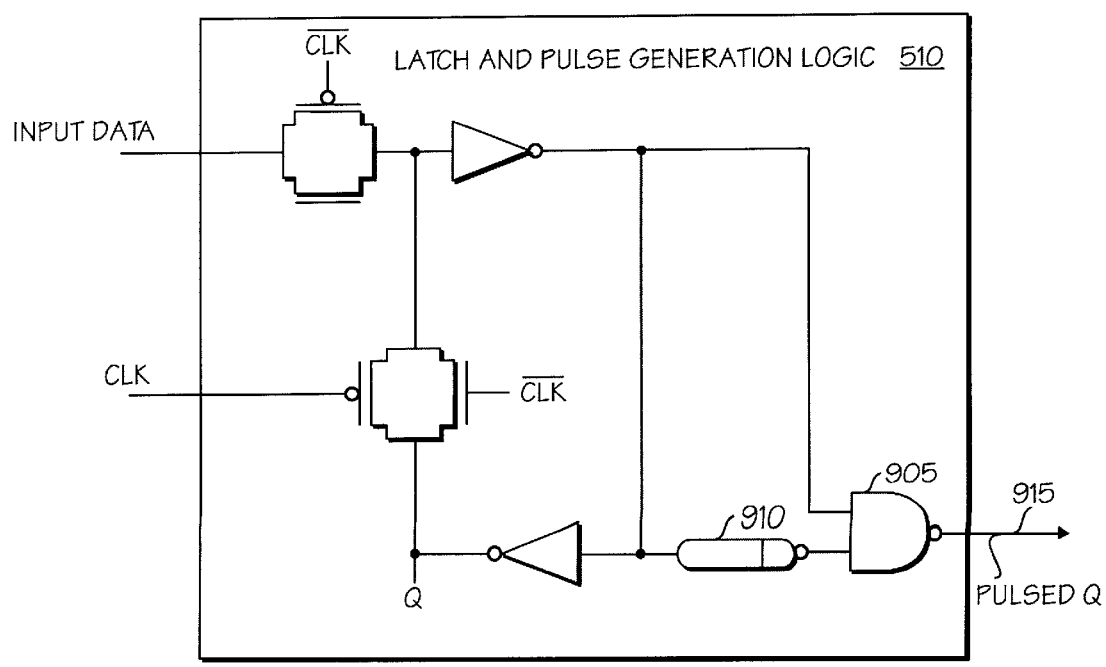
FIG. 9 is a schematic diagram of static latch and pulse generation logic of one embodiment that provides negative pulse encoding.

FIG. 9 is a schematic diagram of one embodiment of the latch and pulse generation logic 510 that may be used where a negative pulse encoding scheme is used. The latch and pulse generation logic 510 of FIG. 9 includes a NAND gate 905 and a delay element 910. The latch and pulse generation logic 510 of FIG. 9 operates in a manner similar to the latch and pulse generation logic 510 of FIG. 8, except that it uses a negative pulse encoding scheme to provide pulse-encoded data at an output 915.

Figure 10:
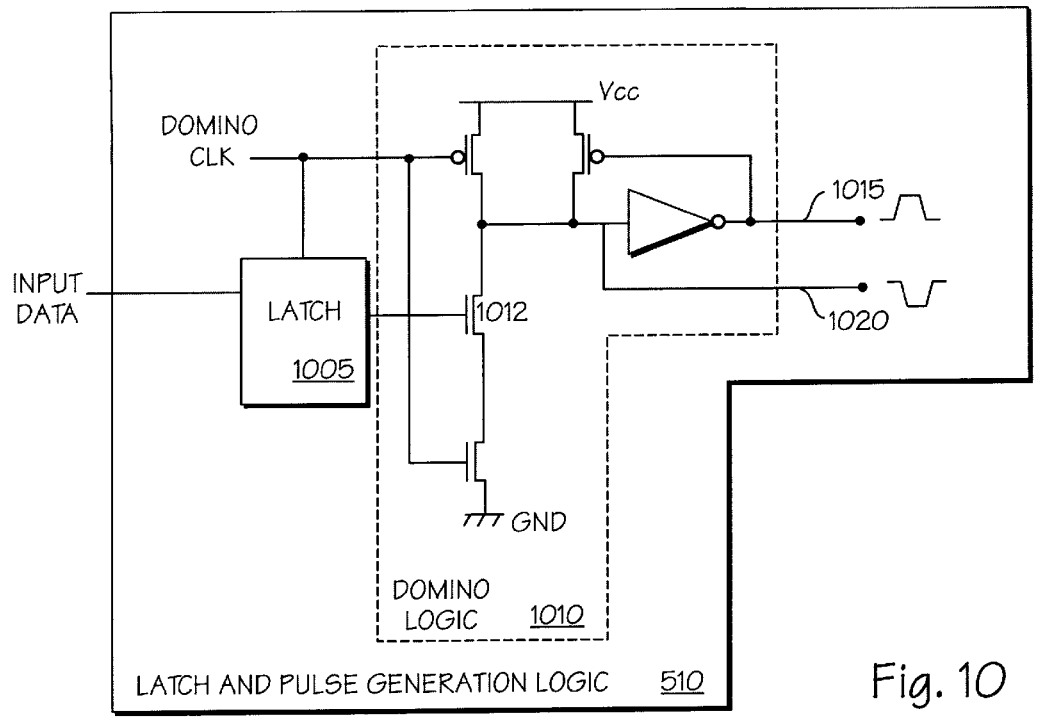
FIG. 10 is a schematic diagram of latch and pulse generation logic of another embodiment wherein pulse encoding is provided by first stage domino logic.

FIG. 10 is a schematic diagram showing another embodiment of the latch and pulse generation logic 510. For the embodiment shown in FIG. 10, a latch 1005 is coupled to receive and latch input data from preceding logic or another signal source (not shown). Domino logic 1010 is coupled to an output of the latch 1005 as shown to provide positive and/or negative pulse-encoded signals. Included within the domino logic 1010 is an n-type gate 1012, however the n-type gate may be replaced with any first stage logic that may be included within the chain of gates that is implemented using a network of n-type gates. In this manner, the first stage logic is embedded in the latch and pulse generation logic 510 making the implementation very efficient.

If a skewed gate directly coupled to the latch and pulse generation logic 510 should receive positive pulse-encoded data, the skewed gate is coupled to a latch and pulse generation logic output 1015. Alternatively, if the skewed gate directly coupled to the latch and pulse generation logic 510 should receive negative pulse-encoded data, the skewed gate is coupled to an alternative latch and pulse generation logic output 1020. Both outputs 1015 and 1020 are not necessarily provided for the latch and pulse generation logic 510.

Figure 11:
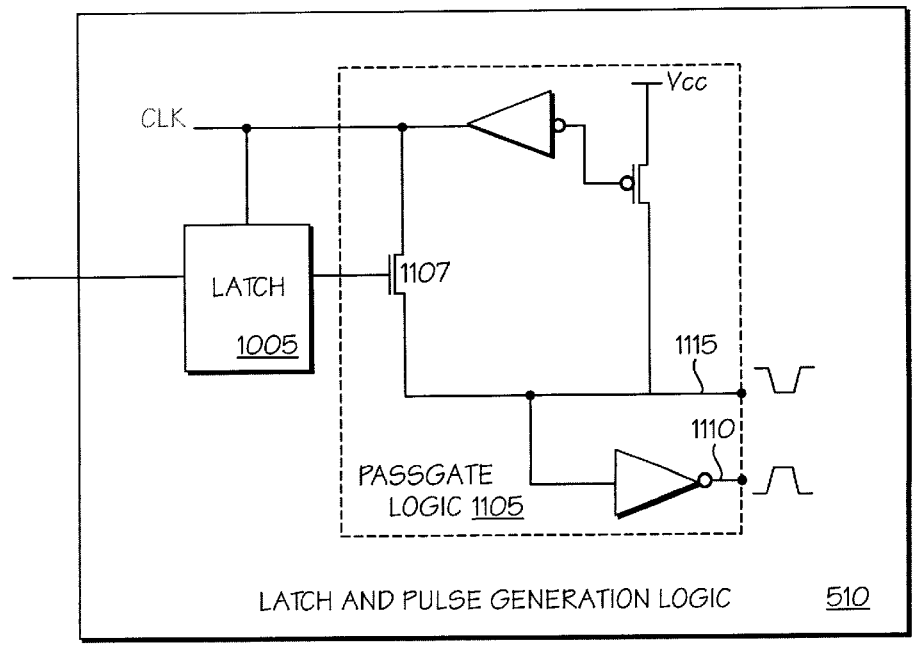
FIG. 11 is a schematic diagram of latch and pulse generation logic of another embodiment wherein pulse encoding is provided by first stage pass gate logic.

FIG. 11 is a schematic diagram showing yet another embodiment of the latch and pulse generation logic 510. For the embodiment shown in FIG. 11, pass gate logic 1105 is coupled to the output of the latch 1005. The pass gate logic 1105 includes an n-type gate 1107 which may be replaced with any first stage logic gate implemented using a network of n-type gates. As above, in this manner, the first stage logic gate may be embedded in the latch and pulse generation logic 510. The pass gate logic 1105 provides a positive pulse-encoded signal at an output 1110 and/or a negative pulse-encoded signal at an output 1115.

For the embodiments shown in FIGS. 10 and 11, little to no delay penalty is incurred in generating pulse-encoded signals.

Although several embodiments of latch and pulse generation logic 510 have been described herein, it will be appreciated that other embodiments may include different configurations for the latch and pulse generation logic 510. Further, for some embodiments, a synchronization element may be provided in place of the latches shown in latch and pulse generation logic 510 of FIGS. 8–11 to line up signals on clock boundaries.

Figure 12:
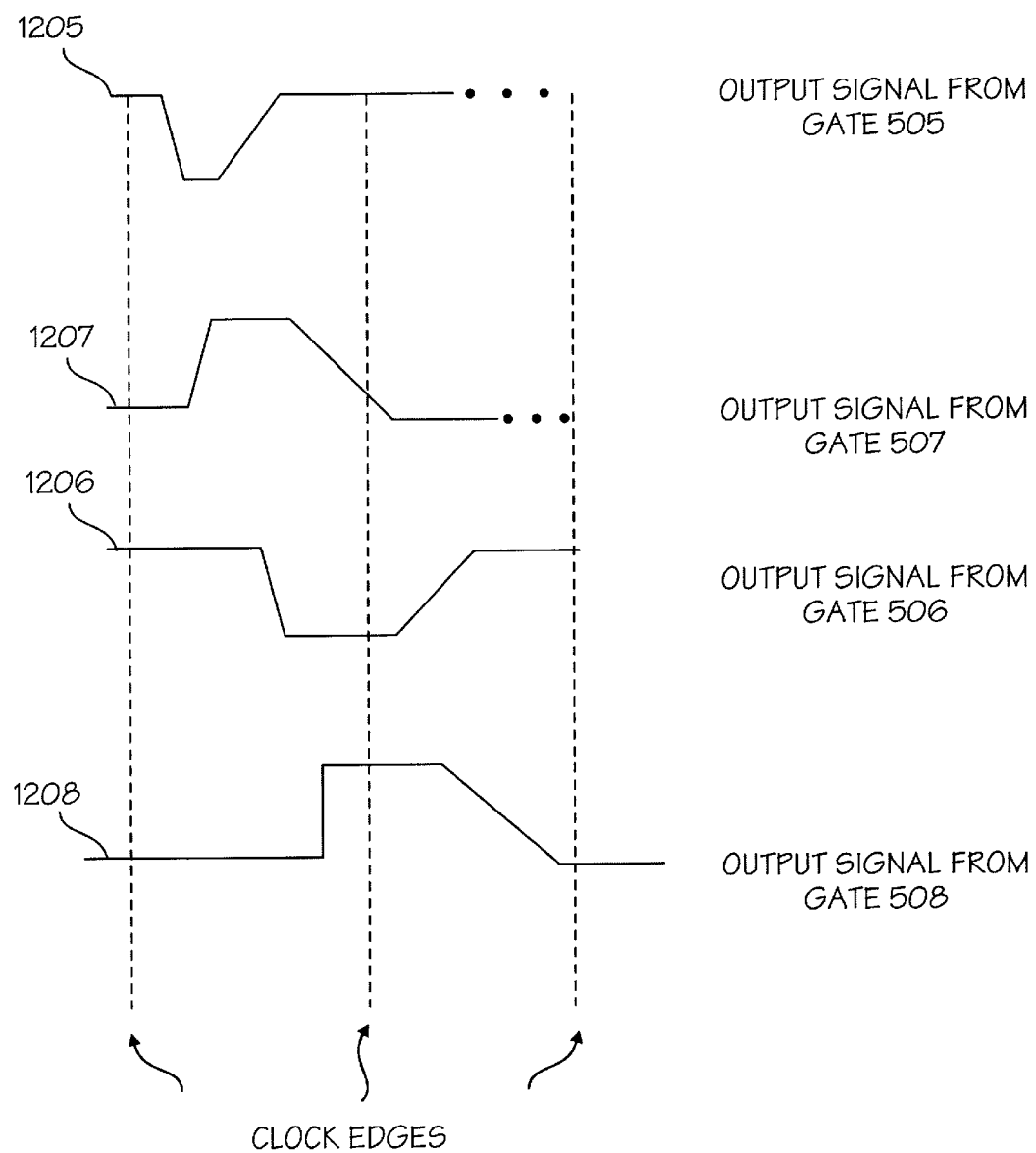
FIG. 12 is a timing diagram showing exemplary output waveforms from the alternately skewed gates of FIG. 5 in relation to each other.

Referring back to FIG. 5, because the gates 505–508 are each skewed for fast signal transitions in a particular direction, and thus, also each have a slow signal transition direction, an input pulse to each of the gates 505–508 is widened after passing through the gate. This concept is illustrated in FIG. 12.

Each of the gates 505–508 is an inverting gate such that an output signal of each of the gates 505 is logically inverted with respect to an input signal into each of the gates 505–508. In accordance with this example, representations of exemplary output signals 1205–1208 from each of the gates 505–508, respectively, are shown in FIG. 12. As can be seen, the output signal pulse 1205 from the gate 505 is significantly narrower than the output signal pulse 1208 from the gate 508 that is further down the chain of gates 501.

Referring back to FIG. 5, in order to ensure that incorrect data is not latched by the latch 515 at the far end of the chain of gates 501 due to this pulse widening effect, there is a limit on the extent to which the gates 505–508 can be skewed. This limit is determined, for one embodiment, by a requirement that the logic value must be reset at the input of the latch 515 before the arrival of subsequent clock cycles at the latch 515. This condition can be satisfied if the range of skew for each of the gates 505–508 is limited such that the reset edge of a signal (the slow signal transition edge for a particular gate) arrives at the latch 515 before the fourth clock transition following the clock transition that begins the evaluate phase. Further, the evaluate edge (the fast signal transition edge) should arrive at the latch 515 prior to the second clock transition edge following the clock transition that begins the evaluate phase. Alternatively, the chain of gates 501 can be viewed as a whole with the range of skew being varied across the gates 505–508, but still limited overall as described above. In either manner, it will be ensured that incorrect data is not latched by the latch 515.

Using the approaches described above, a signal may be more quickly communicated through a chain of gates including alternately skewed gates than through a chain of similar gates that are balanced. One or more of the embodiments described above may provide the additional advantage that, at very low supply voltages, a chain of gates including alternately skewed gates may transmit a signal more quickly than corresponding domino logic. For one embodiment, the above approach may be used in logic blocks and/or wherever domino logic may be used.

Figure 13:
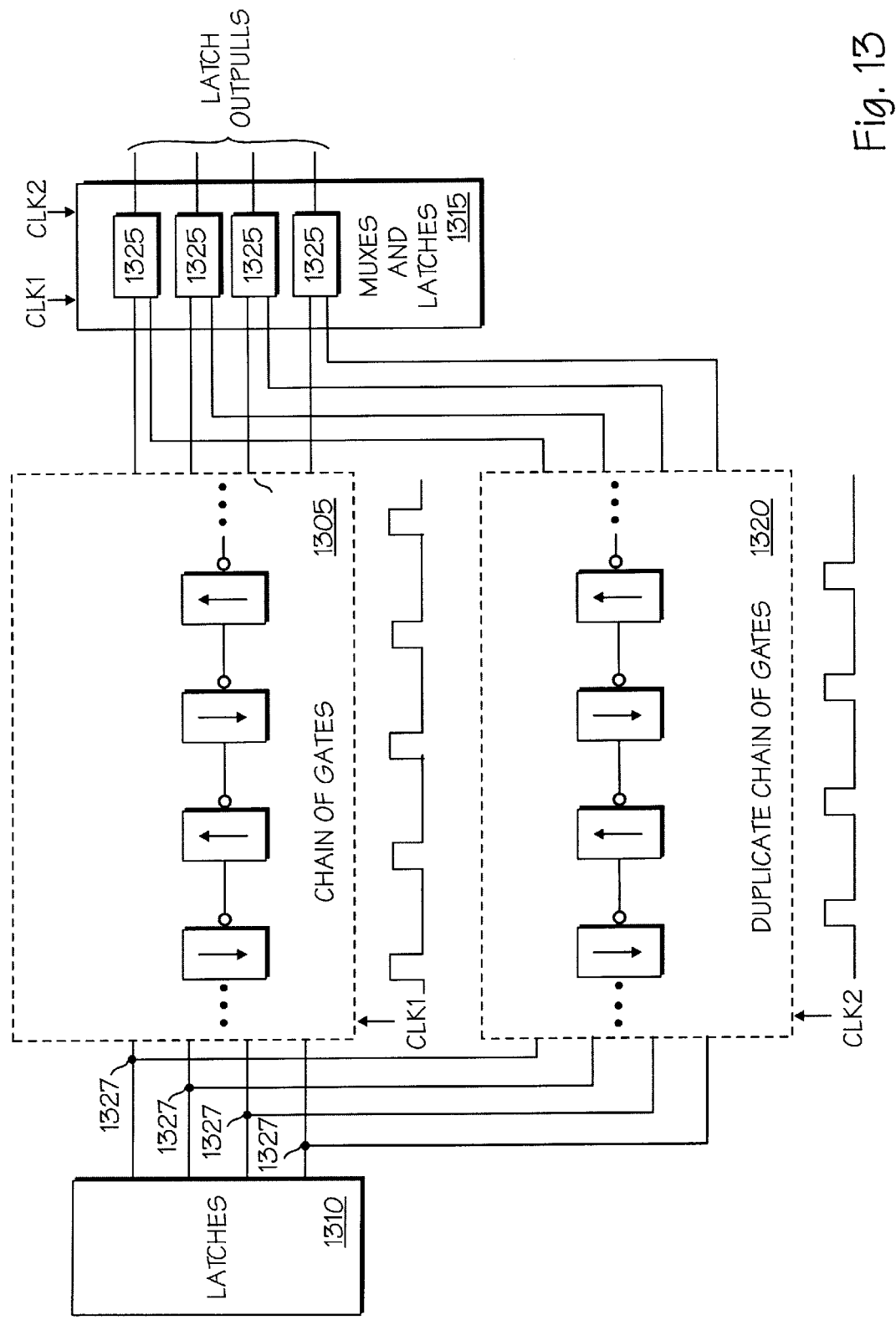
FIG. 13 is a block diagram of a signal transmission delay reduction approach in accordance with another embodiment including duplicate chains of alternately skewed gates.

FIG. 13 is a block diagram of another approach to reducing signal transmission delay that may provide additional robustness over the embodiments described above. For the embodiment shown in FIG. 13, a first chain of gates 1305 is coupled between latch(es) 1310 and multiplexer(s) (mux(es)) and latch(es) 1315. A second, identical chain of gates 1320 is also coupled between latch(es) 1310 and mux(es) and latch(es) 1315 in parallel with the first chain of gates 1305. Although four inputs and four outputs are shown to and from each of the chains of gates 1305 and 1320, it will be appreciated that a different number of inputs and/or outputs may be provided depending on the configuration of the chains of gates 1305 and 1320.

The latch(es) 1310 include a latch corresponding to each of the inputs into the chains of gates 1305 and 1320. Similarly, the mux(es) and latch(es) 1315 include a mux (also referred to herein as selection logic) and latch 1325 corresponding to each of the outputs from the chains of gates 1305 and 1320.

In operation, input data is provided alternately to the chain of gates 1305 and the duplicate chain of gates 1320 during alternate clock cycles. For one embodiment, this is accomplished by using two clock signals: clk 1 to clock data provided to the chain of gates 1305 and clk 2 to clock data provided to the duplicate chain of gates 1320. Switches 1327 may also be provided to direct the data to one of the chains of gates 1305 or 1320. In this manner, each of the chain of gates 1305 and the duplicate chain of gates 1320 receives data every other clock cycle (where clk 1 and clk 2 frequencies are half the frequency of a clock used to clock other logic in the circuit that includes the chains of gates 1305 and 1320.) Thus, while one of the chains of gates 1305 or 1320 is in an evaluation mode, the other is in a reset mode and vice versa. The mux(es) and latches 1325 then select the appropriate output signal to provide at each of the latch outputs.

Figure 14:
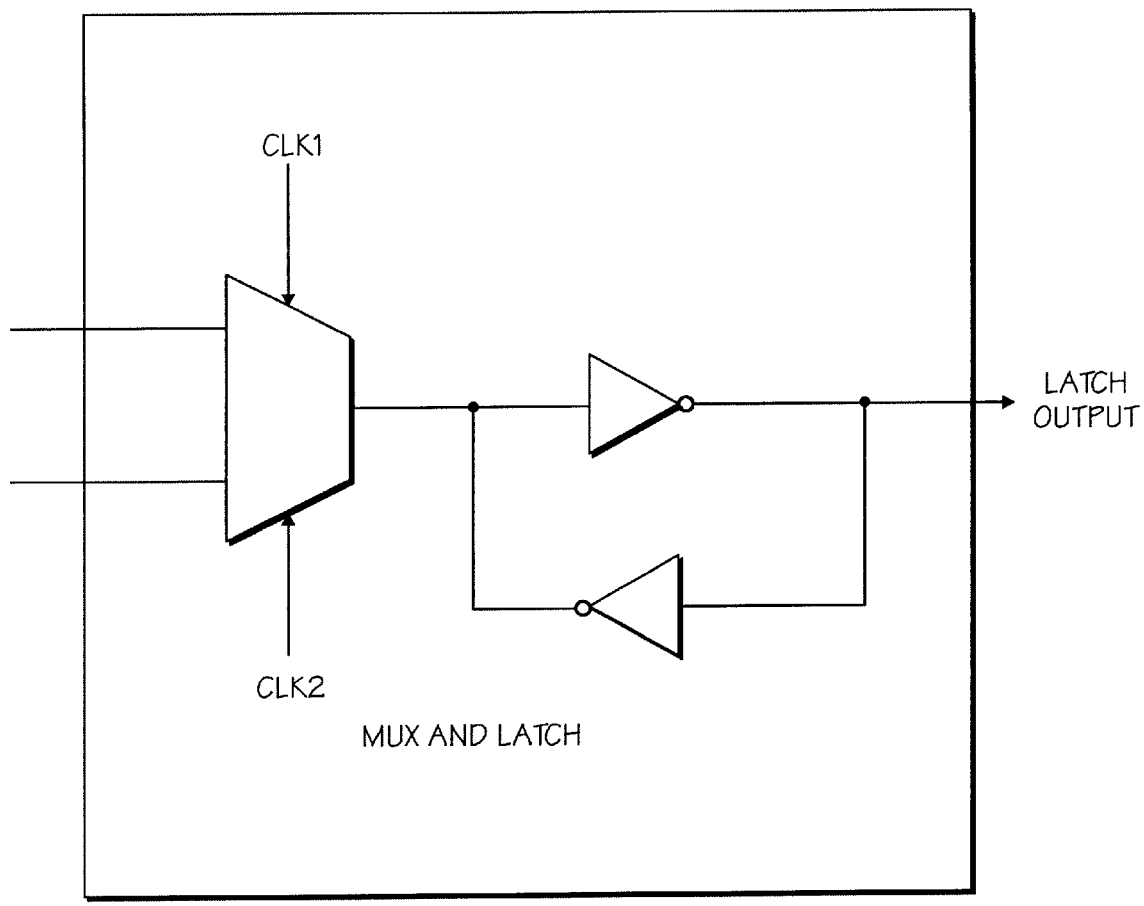
FIG. 14 is a logic diagram showing one embodiment of the multiplexer and latch of FIG. 13.

An example of a mux and latch configuration that may be used for the mux(es) and latch(es) 1325 is shown in FIG. 14. The first and second clock signals, clk 1 and clk2, respectively, are used as select signals to select which of the input signals is passed on to the latch. In this manner, the mux(es) select between the input signals provided by the chains of gates 1305 and 1320 based on the signal that was previously selected such that the selection alternates between the chains of gates 1305 and 1320. For one embodiment, only a small delay penalty is incurred by using the mux(es) to select the desired output signal because they are used to replace a transmission gate in a static latch.

For other embodiments, additional duplicate chains of gates may be used. For the embodiment described above, because data is provided alternately to the chains of gates 1305 and 1320 on clock boundaries such that the clock signals are utilized to generate pulses, pulse encoding logic like that described above does not need to be used. For other embodiments, however, pulse encoding logic may be used at the latches 1310 to alternately provide data to the chains of gates 1305 and 1320. For such embodiments, it may be possible to increase the time available for a reset phase for each of the chains of gates 1305 and 1320.

The configuration described with reference to FIG. 14, in addition to enabling faster signal transmission through the chains of gates, provides additional robustness through interleaving of the duplicate chains of gates. While duplicate chains of gates are provided, the power dissipation of the embodiment shown in FIG. 14 is approximately the same as a circuit that includes only one of the chains of gates 1305 or 1320. This is because the activity factor of each of the duplicate chains of gates 1305 and 1320 is about half that of only one of the chain of gates 1305 or 1320 operating alone.

For yet another embodiment, alternately skewed gates may be used to reduce interconnect signal transmission delay. An example of one such embodiment is shown in FIG. 15. As discussed above, a current practice to reduce interconnect transmission delay involves the placement of repeaters, (often buffers or inverters) along the length of an interconnect. Using repeaters, the signal transmission delay of a particular interconnect more closely approximates a linear relationship with interconnect length.

For the embodiment shown in FIG. 15, a chain of repeaters 1506–1508, buffers in this example, is coupled in series along an interconnect 1509 between a pulse generation circuit 1510 and a receiver circuit 1515. Unlike the repeaters used in prior approaches, the repeaters 1505–1508 are alternately skewed for fast low-to-high and fast high-to-low transitions as described above. More specifically, in the example shown in FIG. 15, the repeaters 1505 and 1507 are fast rise gates while the repeaters 1506 and 1508 are fast fall gates. It will be appreciated that additional unskewed or alternately skewed gates may be included between the repeater 1505 and the pulse generation circuit 1510 and/or between the repeater 1508 and the receiver 1515. Additionally, one or more balanced gates may be included between any one of the skewed gates 1505–1508.

In operation, the pulse generation circuit 1510 receives a signal 1520 to be transmitted over the interconnect 1509 and a clock signal CLK at its inputs. Based on data provided by the signal 1520, the pulse generation circuit 1510 provides a pulse-encoded signal at an output 1525 of the pulse generation circuit 1510 to the chain of gates including the gates 1505–1508. The pulse-encoded signal is then received by the receiver 1515. For one embodiment, the receiver 1515 is clocked to latch the incoming data as it is received. For another embodiment, the receiver includes a decoder circuit to decode the pulse-encoded data.

As with some embodiments discussed above, the pulse generation circuit 1510 may be selected to provide a positive pulse-encoded output signal or a negative pulse-encoded output signal at the pulse generation circuit output 1525. This selection depends on whether the gate immediately coupled to the pulse generation circuit 1510 is skewed for fast rise or fast fall.

FIG. 16 shows an example of one embodiment of the pulse generation circuit 1510 that may be used to provide positive pulse encoding. As shown, one input of a NAND gate 1605 is coupled to receive the signal 1520 while the other input is coupled to receive the clock signal CLK. An output of the NAND gate 1605 is coupled to a delay element 1610 which is coupled to one input of a NOR gate 1615. The other input of the NOR gate 1615 is coupled directly to the output of the NAND gate 1605. Using the described circuitry, a positive pulse is generated for each clock cycle during which a logical one is indicated by the signal 1520. Otherwise the signal at the output 1525 remains at a logical zero level.

FIG. 17 is a schematic diagram of one embodiment of the pulse generation circuit 1510 that may be used to provide negative pulse encoding of the signal 1520. The negative pulse generation circuit 1510 of FIG. 17 includes a first NAND gate 1705 coupled to receive the signal 1520 and the clock signal CLK. An output of the NAND gate 1705 is coupled to a delay element 1710 and directly to one input of a second NAND gate 1715. The delay element is coupled to another input of the NAND gate 1715 such that an output of the NAND gate 1525 provides a negative pulse-encoded signal corresponding to the data signal 1520. Using the described circuitry, a negative pulse (from a logical one to a logical zero and back) is generated for each clock cycle during which a logical zero is indicated by the signal 1520. Otherwise the negative pulse-encoded signal remains at a logical one level.

It will be appreciated that different types of pulse generation circuits configured in another manner that also provide positive and/or negative pulse-encoded output signals may be used for other embodiments.

By alternating repeaters 1505 and 1507 skewed for fast rise with repeaters 1506 and 1508 skewed for fast fall and using a pulse encoding scheme, the embodiment shown in FIG. 15 decreases interconnect 1509 signal transmission delay as compared to an interconnect that includes an identical number of similar repeaters that are not skewed (i.e. balanced).

Figure 18:
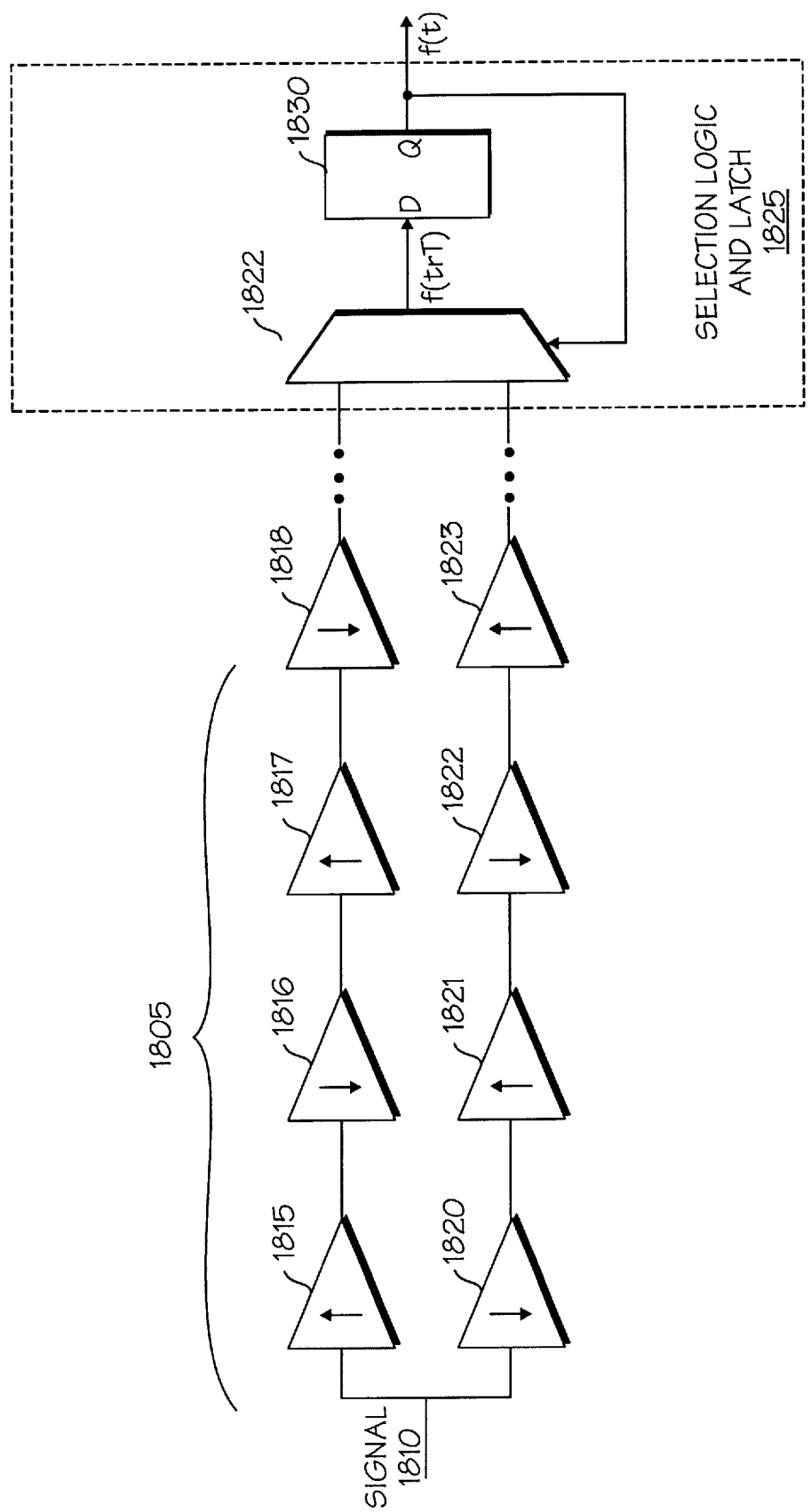
FIG. 18 is a block and logic diagram showing a signal transmission delay reduction approach of another embodi

Another approach to using skewed repeaters to reduce interconnect delay is shown in FIG. 18. In the embodiment illustrated in FIG. 18, an interconnect 1805 includes two paths through which a signal 1810 to be transmitted is communicated. The signal 1810, for this embodiment, is not pulse-encoded. A first path includes repeaters 1815–1818 wherein the first repeater 1815 coupled to receive the signal 1810 is skewed for fast rise. The remaining repeaters 1816–1818 are alternately skewed for fast fall and fast rise as shown. Additional alternately skewed repeaters may be included between the repeater 1818 and selection logic and latch 1825.

A second path includes repeaters 1820–1823 wherein the first repeater to receive the signal 1810 is skewed for fast fall. The remaining repeaters 1821–1823 are alternately skewed for fast rise and fast fall as shown. Thus, each repeater in the first path including repeaters 1815–1818 has a corresponding repeater in the second path that is skewed in an opposite manner.

The first and second paths including the skewed repeaters 1815–1818 and 1820–1823, respectively, are coupled to the selection logic and latch 1825. The signal 1810 is transmitted via both the first and second paths concurrently. The selection logic and latch 1825 then operates to select, based on data that was previously latched (f(t)), the data that arrives first via either the first or second path at the selection logic and latch 1825. Thus, if a logical one was previously latched, the selection logic and latch 1825 continues to store a logical one until a signal first received from either the first path or the second path indicates a logical zero. Because the selection logic and latch 1825 is looking for a logical 0, the selection logic and latch will latch data f(t+T) (where T is the clock duration) from whichever of the first or second paths is a fast fall path overall. Similarly, if the transition of interest is from 0 to 1, the selection logic 1825 will select the signal received by whichever of the first or second paths is a fast rise path overall. At that time, the selection logic and latch 1825 latches the new data from the fastest of the first or second path.

One configuration of the selection logic and latch 1825 including a multiplexer 1827 and a toggle flip-flop 1830 is shown in FIG. 18. It will be appreciated by those of ordinary skill in the art that different circuit configurations may be used for other embodiments to provide the above-described functionality.

FIG. 19 illustrates an interconnect delay reduction approach in accordance with another embodiment. For the embodiment shown in FIG. 19, a signal 1905 to be transmitted across an interconnect 1910 is received by a pulse encoding circuit 1915. One embodiment of the pulse encoding circuit 1915 is shown in FIG. 19. The signal 1905 is received directly by a first input of an exclusive OR gate 1920 and by a second input of the exclusive OR gate 1920 through a delay element 1925. A pulse-encoded output signal 1930 is provided at an output of the exclusive OR gate 1920 to a chain of series-coupled repeaters including the gates 1935–1937. It will be appreciated that other types of pulse encoding circuits that provide similar functionality to the pulse encoding circuit 1915 of FIG. 19 may be used for other embodiments.

FIG. 20 is a diagram showing exemplary waveforms for the input signal 1905 that is received by the pulse encoding circuit 1915 (FIG. 19) and a corresponding pulse-encoded output signal 1930 that is provided at the output of the pulse encoding circuit 1915. It is appreciated that actual input and output waveforms may indicate different data than the exemplary waveforms of FIG. 20. As shown in FIG. 20, for each transition of the input signal 1905, a pulse is generated in the output signal 1930. Thus, the pulse encoding scheme of FIGS. 19 and 20 is different than the pulse encoding schemes described for other embodiments.

Referring back to FIG. 19, the pulse-encoded data signal 1930 is transmitted through the gates 1935–1937 and any other gates that are arranged along the interconnect 1910. The gates 1935 and 1937 are skewed for fast rise while the gate 1936 is skewed for fast fall. The fast rise and fast fall gates are alternately skewed along the length of the interconnect 1910 to reduce the signal transmission delay of the interconnect 1910 as described above. For the embodiment shown in FIG. 19, the gate 1935 immediately coupled to the pulse encoding circuit 1915 is selected to be a fast rise gate because it is a non-inverting buffer that receives a positive pulse-encoded signal. For another embodiment, it will be appreciated that a negative pulse encoding scheme may be used and the repeaters along the interconnect 1910 may be skewed in a another manner, or a different type of gate, such as an inverter, may be used to provide the repeaters.

Because the input data is encoded in pulses for each signal transition, a decoding circuit 1940 is used at a receiving end of the interconnect 1910. The decoding circuit 1940 of one embodiment is a toggle flip-flop 1945 that is initialized to a predetermined value and then toggled as each pulse indicating a transition is received by the decoding circuit 1940.

Figure 21:
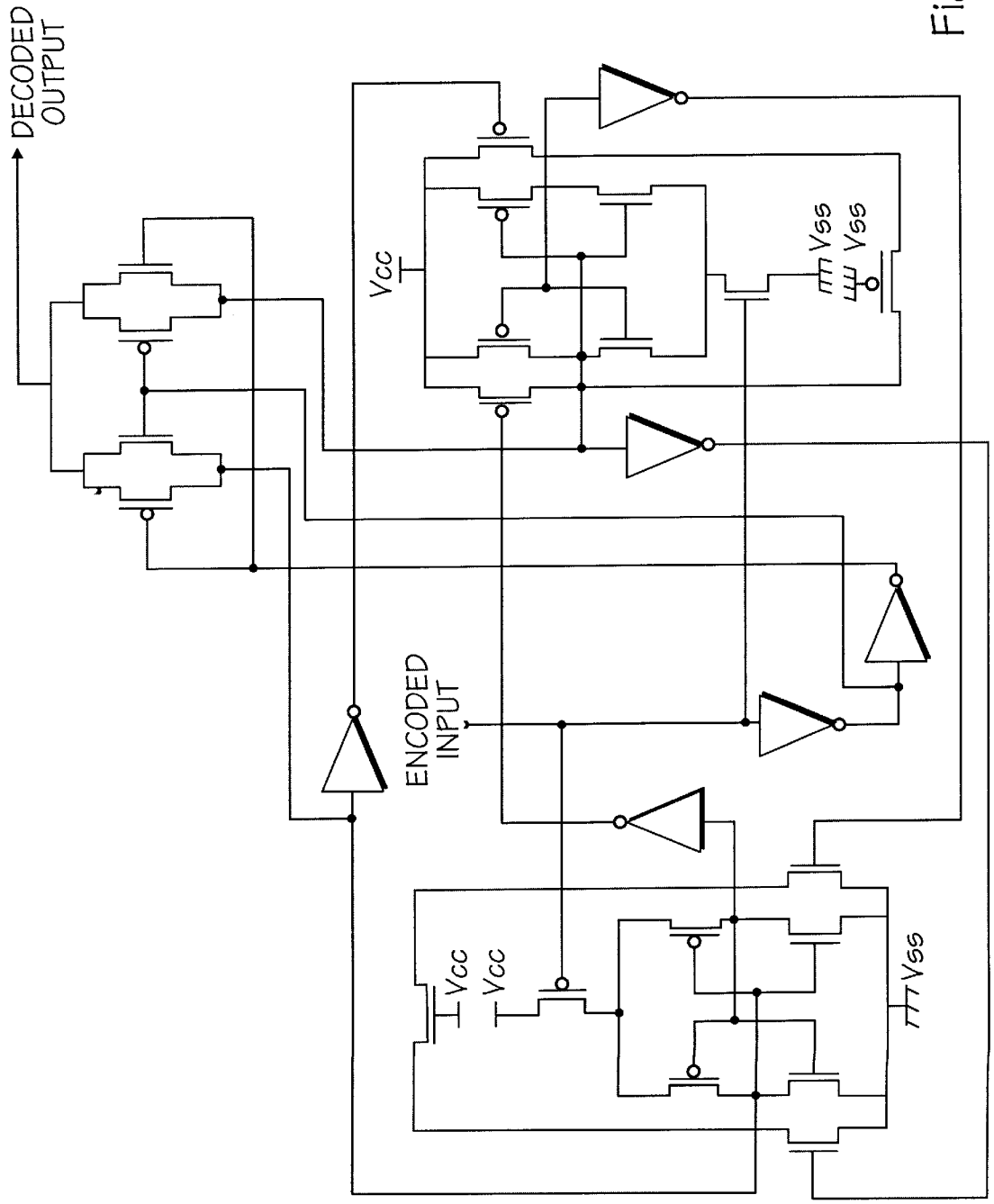
FIG. 21 is a schematic diagram of one embodiment of a decoding circuit that may be used in the circuit of FIG. 19.

FIG. 21 is a schematic diagram illustrating a specific circuit configuration that may be used to provide the decoding circuit 1940. The specific circuit configuration of FIG. 21 is an efficient circuit that provides the same functionality represented by the toggle flip-flop 1945 shown in FIG. 20 with only one gate delay. It will be appreciated that circuits configured in a different manner than the circuit of FIG. 21, including circuits that provide longer delays, may also be used to provide the above described decoding functionality.

The embodiment shown in FIG. 19 provides the advantage that the activity factor of the logic is low. This is due to the use of the above-described pulse encoding scheme, which only provides a pulse for each signal transition.

Figure 22:
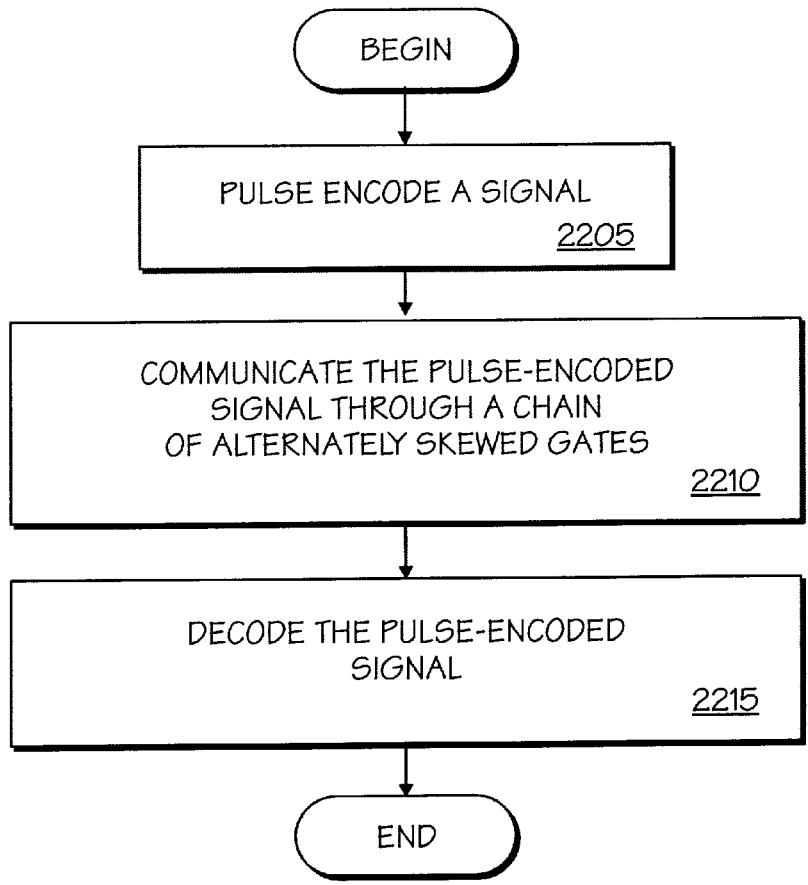
FIG. 22 is a flow diagram showing one embodiment of a method for reducing signal transmission delay using skewed gates.

Referring now to FIG. 22, a method of one embodiment for reducing signal delay using skewed gates is illustrated. In accordance with this embodiment, a signal is pulse encoded as indicated by box 2205. The pulse encoding scheme may be positive or negative. Further the pulse encoding scheme may indicate each signal transition or the pulse encoding scheme may indicate each logical one transition or each logical zero transition depending on the approach used.

The pulse-encoded signal is then communicated through a chain of alternately skewed gates as indicated by the box 2210 and may then be decoded to provide a level-encoded signal as indicated by the box 2215.

Figure 23:
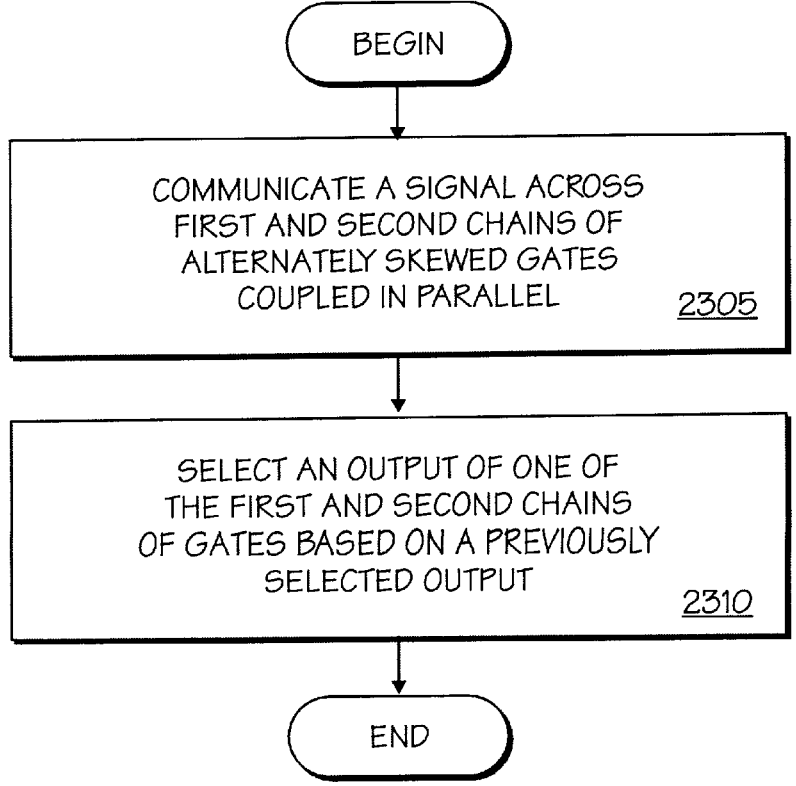
FIG. 23 is a flow diagram showing another embodiment of a method for reducing signal transmission delay using skewed gates.

FIG. 23 is a flow diagram showing another embodiment of a method for reducing signal delay using alternately skewed gates. In accordance with the method illustrated in FIG. 23, a signal is communicated across first and second chains of alternately skewed gates, wherein the first and second chains are coupled in parallel as indicated by box 2305. For one embodiment, the first and second chains are identical and the signal is communicated to the first and second chains on alternate clock pulses. For another embodiment, each gate in the first chain is skewed for an opposite transition than the corresponding gate in the second chain and the signal is communicated to both chains concurrently.

An output of the one of the first and second chains of gates is then selected based on a previously selected output as indicated by box 2310. Where the first and second chains are identical, the output of the first chain is selected if the output of the second chain was previously selected such that the selected output alternates between the two chains. If the first and second chains of gates include corresponding gates skewed for opposite transitions, the output of the fastest of the first and second chains is selected based on the value indicated by the signal previously selected.

It will be appreciated that the above-described methods may include additional actions for alternative embodiments or may not include all of the actions described above.

In the foregoing specification, the invention has been described with reference to specific exemplary embodiments thereof. It will, however be appreciated that various modifications and changes may be made thereto without departing from the broader spirit and scope of the invention as set forth in the appended claims. The specification and drawings are, accordingly, to be regarded in an illustrative rather than a restrictive sense.

What is claimed is:

1. An integrated circuit comprising:
   a first chain of alternately skewed, series-coupled gates;
   pulse encoding logic to pulse encode a signal to be provided to and to be transmitted by the chain of alternately skewed gates; and
   a receiver circuit coupled to the first chain of alternately skewed gates, the receiver circuit to decode both logic high and logic low data indicated by the pulse encoded signal transmitted by the first chain of alternately skewed gates.

2. The integrated circuit of claim 1 wherein the pulse encoding logic is included in a latch that is coupled to receive the signal and wherein the receiver circuit comprises a clocked latch.

3. The integrated circuit of claim 1 wherein the pulse encoding logic is included in one of domino or passgate logic coupled to the chain of alternately skewed gates and wherein the receiver circuit comprises a clocked latch.

4. The integrated circuit of claim 2 wherein the pulse encoding logic is positive pulse encoding logic to provide a positive pulse for each logical one value indicated by the signal.

5. The integrated circuit of claim 2 wherein the pulse encoding logic is negative pulse encoding logic to provide a negative pulse for each logical zero value indicated by the signal.

6. The integrated circuit of claim 1 wherein the pulse encoding logic is to provide a pulse for each logic transition indicated by the signal and wherein the receiver circuit comprises a logical equivalent of a toggle flip-flop.

7. The integrated circuit of claim 1 wherein the pulse-encoded signal includes an evaluate phase and a reset phase, and wherein the total skew in the chain of alternately skewed gates is limited such that the reset phase is no greater than twice as long as the evaluate phase.

8. The integrated circuit of claim 1 wherein the chain of alternately skewed gates is included in a logic block.

9. The integrated circuit of claim 1 wherein the chain of alternately skewed gates is included in an interconnect.

10. An integrated circuit comprising:
    first and second chains of alternately skewed, series-coupled logic gates, the first and second chains being coupled in parallel; and
    selection logic responsive to a logic value indicated by a previously selected signal to select between a first signal received from the first chain of alternately skewed logic gates and a second signal received from the second chain of alternately skewed logic gates.

11. An integrated circuit comprising:

first and second chains of alternately skewed, series-coupled logic gates, each of the logic gates in the first chain of alternately skewed logic gates being skewed in a same direction as a corresponding gate in the second chain of alternately skewed logic gates, wherein an input signal is to be alternately provided to the first and second chains on alternate clock pulses; and receiver circuitry to select between a first signal received from the first chain of alternately skewed logic gates and a second signal received from the second chain of alternately skewed logic gates.

12. The integrated circuit of claim 11 wherein the receiver circuitry includes a multiplexer that is responsive to the alternate clock pulses to select between the first and second signals.

13. The integrated circuit of claim 10 wherein each of the logic gates in the first chain of alternately skewed logic gates is skewed in an opposite direction from a corresponding gate in the second chain of alternately skewed logic gates.

14. The integrated circuit of claim 13 wherein an input signal is provided concurrently to the first and second chains of alternately skewed logic gates and wherein the selection logic selects the first of the first and second signals to arrive with the expected logic value.

15. The integrated circuit of claim 14 wherein the selection logic includes a flip-flop to select the fastest of the first and second paths based on a logical value previously latched.

16. A method comprising:

pulse encoding a signal;

communicating the pulse-encoded signal through a first chain of alternately skewed, series-coupled gates; and decoding the pulse encoded signal communicated through the first chain of gates to provide a corresponding decoded signal that indicates both logic high and logic low signal levels.

17. The method of claim 16 further including:

latching data indicated by the pulse-encoded signal communicated through the chain of alternately skewed gates.

18. The method of claim 16 wherein pulse encoding the signal includes generating a pulse for each transition of the signal.

19. The method of claim 16 wherein pulse encoding the signal includes generating a pulse for each low to high transition of the signal if a positive pulse encoding scheme is used, and generating a pulse for each high to low transition of the signal if a negative pulse encoding scheme is used.

20. A method comprising:

communicating a signal across first and second chains of alternately skewed, series-coupled gates, the first and second chains being coupled in parallel; and selecting an output of one of the first and second chains of alternately skewed gates based on a logic value indicated by a previously selected output.

21. The method of claim 20 wherein communicating the signal includes concurrently providing the signal to the first and second chains of alternately skewed gates, and wherein selecting the output of one of the first and second chains of alternately skewed gates includes selecting the output of the fastest of the first and second chains of gates.

22. A method comprising:

providing a signal to first and second chains of alternately skewed, series-coupled gates on alternate clock pulses, each of the gates in the first chain of gates being skewed for a same signal transition as a corresponding gate in the second chain of gates; and alternately selecting the output of the first and second chains of skewed gates in response to the alternate clock pulses.

23. An apparatus comprising:

a first chain of alternately skewed, series-coupled gates;

a means for pulse encoding an input signal to the chain of alternately skewed gates; and a means for decoding the pulse encoded signal communicated by the first chain of alternately skewed gates to produce a corresponding output signal that indicates both high and low logic levels.

24. The apparatus of claim 23 wherein the means for pulse encoding comprises one of static metal oxide semiconductor (MOS), domino or pass gate logic.

25. An apparatus comprising:

first and second chains of alternately skewed, series-coupled logic gates, the first and second chains being coupled in parallel; and a means for selecting between a first signal provided by the first chain of alternately skewed logic gates and a second signal provided by the second chain of alternately skewed logic gates, the means for selecting being responsive to the logic state indicated by a previously selected signal.

26. The apparatus of claim 25 wherein the means for selecting comprises a multiplexer and a flip flop.

* * * * *